(12) United States Patent
Ray et al.

(10) Patent No.: US 6,451,502 B1
(45) Date of Patent: Sep. 17, 2002

(54) MANUFACTURE OF ELECTRONIC PARTS

(75) Inventors: Kevin Barry Ray, Castleford; Anthony Paul Kitson, West Yorkshire, both of (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 35 days.

(21) Appl. No.: 09/685,390

(22) Filed: Oct. 10, 2000

(51) Int. Cl.[7] ............................................... E03C 7/004
(52) U.S. Cl. ..................... 430/270.1; 430/311; 430/317; 430/318; 430/325; 430/330
(58) Field of Search .............................. 430/270.1, 311, 430/317, 318, 325, 330

(56) References Cited

U.S. PATENT DOCUMENTS

| | | | |
|---|---|---|---|
| 4,869,994 A | * 9/1989 | Gupta et al. | ................ 430/197 |
| 4,929,537 A | * 5/1990 | Gupta et al. | ................ 430/325 |
| 5,372,907 A | 12/1994 | Haley et al. | ................ 430/157 |
| 5,401,619 A | * 3/1995 | Boggs et al. | ................ 430/343 |
| 5,493,971 A | * 2/1996 | Lewis et al. | ................ 101/454 |
| 5,527,659 A | 6/1996 | Yamaoka et al. | ........... 430/179 |
| 5,534,393 A | * 7/1996 | Boggs et al. | ................ 430/348 |
| 5,725,994 A | 3/1998 | Kondo | ................... 430/270.1 |
| 5,814,431 A | 9/1998 | Nagasaka et al. | ......... 430/281.1 |
| 5,919,601 A | 7/1999 | Nguyen et al. | .......... 430/278.1 |
| 5,943,601 A | * 8/1999 | Usui et al. | ................... 438/688 |
| 5,968,713 A | * 10/1999 | Nozaki et al. | .............. 430/326 |
| 6,153,353 A | * 11/2000 | Van Damme et al. | ... 430/270.1 |

FOREIGN PATENT DOCUMENTS

| | | |
|---|---|---|
| EP | 652483 | 5/1995 |
| EP | 819985 | 1/1998 |
| EP | 874282 | 10/1998 |
| EP | 899614 | 3/1999 |
| JP | 09-166870 | * 6/1997 |
| WO | WO 9739894 | 10/1997 |
| WO | WO 9908879 | 2/1999 |
| WO | WO 0020222 | 4/2000 |

* cited by examiner

*Primary Examiner*—Janet Baxter
*Assistant Examiner*—Amanda C. Walke
(74) *Attorney, Agent, or Firm*—Baker Botts L.L.P.

(57) ABSTRACT

A precursor for electronic parts, for example printed circuit boards, has a negative-working thermally-imagable layer on a substrate, for example a copper board or semiconductor. The layer comprises a cross-linking agent, a thermally-activated acid generator, and a polymeric substance containing polyvinylphenol units and alkyl acrylate units. Such as layer has improved mechanical properties with maintenance of good imaging properties.

12 Claims, 1 Drawing Sheet

Figure 1

A. Micrograph of surface produced by Plot 210 of Example 13 after developing and etching.

B. Micrograph of surface produced by Plot 210 of Example 13 after developing, etching, and stripping.

A. Micrograph of surface produced by Plot 210 of Example 14 after developing and etching.

B. Micrograph of surface produced by Plot 210 of Example 14 after developing, etching, and stripping.

A          B

MANUFACTURE OF ELECTRONIC PARTS

BACKGROUND OF THE INVENTION

1. Field of the Invention

This invention relates to electronic parts and to their production using negative working radiation sensitive compositions.

2. Background Information

We have developed novel radiation sensitive compositions and in our earlier-filed U.S. Pat. Nos. 5,372,907 and 5,919,601 we disclosed these novel compositions and their use as imagable coatings for lithographic printing form precursors. We later determined that such compositions are suitable as radiation sensitive coatings for printed circuit and other electronic part precursors. However they are not optimal for use as coatings on all electronic part precursors. In particular, they are not optimal for use as coatings on thin, flexible substrates which are the precursors for some electronic parts and they are not flexible substrates which are the precursors for some electronic parts and they are not optimal for use on substrates required to be coated and imaged on both sides. For such applications we have sought a composition which can better withstand flexure and surface contact, without becoming scratched, cracked, flaked or delaminated. We have now devised a particular class of heat sensitive compositions which are extremely suitable for such applications.

The coatings used in pattern forming methods for electronic parts such as printed circuits are classified into two types: negative working and positive working. After exposure to radiation and development, the coating pattern is used as a screen for forming the patterns onto the underlying electronic elements—for example by etching an underlying copper foil. Due to the high resolution demands and the requirements of high resistance to etching techniques, positive working systems are widely used. In particular, in the main there have been used alkali developable positive working coatings mainly composed of alkali-soluble novolac resins as disclosed in J.C. Streiter, Kodak Microelectronics Seminar Proceedings, 1979, p. 116. The primary active component of such positive working compositions, both in the context of lithographic printing forms and electronic parts, is a naphthoquinonediazide (NQD) derivative.

The types of electronic parts whose manufacture may use a radiation sensitive coating include printed wiring boards (PWBs), thick- and thin-film circuits, comprising passive elements such as resistors, capacitors and inductors; multichip devices (MDCs); integrated circuits (ICs); and active semiconductor devices. The electronic parts may suitably comprise conductors, for example: copper board; semiconductors, for example silicon or germanium; and insulators, for example silica as a surface layer with silicon beneath, with the silica being selectively etched away to expose portions of the silicon beneath (a step in the manufacture of, e.g., field effect transistors).

In U.S. Pat. No. 5,372,907 there is described a radiation-sensitive composition for a lithographic printing plate. The composition can be used in positive-working and negative-working manners. The composition comprises a resole resin, a novolac resin, a latent Bronsted acid and an infra-red absorber. The negative-working method involves imagewise exposure to activating radiation, heating overall to effect cross-linking selectively in those regions which had been imagewise exposed, and development to selectively remove the other regions. This composition and method gives excellent imaging for printing plates, and is in commercial use. However, it is unsuitable for use in the field of electronic part manufacture because PCB substrates would not withstand flexure and surface contact without becoming scratched, cracked, flaked or delaminated.

U.S. Pat. No. 5,919,601 describes similar technology, involving use of a composition comprising a binder resin, a cross-linking resin and a thermally activated acid generator as a printing plate coating. The plates were imaged using IR radiation, then heated overall to produce the required cross-linking reactions, then developed, to remove the regions which had not received the IR radiation. Again, imaging properties are believed to be good but mechanical properties are believed to be inadequate for applications involving the manufacture of electronic parts, such as PCBs.

U.S. Pat. No. 5,527,659 describes a chemical amplification resist composition comprising a binder, a photochemical acid generator, and a squarylium compound. Example 1 describes its coating onto a grained and anodised plate. The binder was poly-p-hydroxystyrene. It was subjected to radiation of wavelength of 630 nm, then heat treated, then developed, then inked up, for printing. Other binders are also described.

EP 819985A describes negative-working lithographic printing plates having a phenolic hydroxy group-containing resin, a latent Bronsted acid, an infra-red absorber and an amino cross-linking agent. The plates are subjected imagewise to infra-red radiation, then subjected to post-exposure bake, prior to development to remove non-imaged areas. Suitable resins are said to include novolacs and polyvinylphenols. EP 819980A is a very similar disclosure, where the infra-red absorber is carbon black. Suitable resins are stated to include novolacs, polyvinylphenols and phenolic hydroxy functionalized derivatives of poly(meth)acrylates, which can be synthesized starting from, for example, hydroxyethyl(meth)acrylate.

U.S. Pat. No. 5,814,431 describes a negative-working photosensitive resin used for a lithographic printing plate, and comprising a novolac or polyvinyl phenol resin, an amino compound able to cure the composition, a defined cyanine or polymethine compound able to absorb near infra-red radiation, and a photosensitive acid-forming generator. When a polyvinyl phenol resin is used an unsubstituted polyvinyl phenol resin is preferred, but hydroxyl groups thereof are protected by t-butoxycarbonyl, pyranyl or furanyl groups. Imaging involves laser irradiation, typically at 830 nm, a post-exposure bake, and development, to remove the regions which had not been struck by the laser beam. The plates are said to have good stability, good sensitivity and good inking-up properties.

U.S. Pat. No. 5,725,994 discloses novel negative-working photosensitive compositions useful for making heat mode lithographic printing plates. The compositions comprise an acid precursor, a particular hydroxyimide compound, and a hydroxyl group-containing linear polymer. The linear polymer may be an acrylate polymer. Imaging involves delivery of light, for example from a mercury lamp, then the heating of the imaged part, prior to development.

EP-A-899614 discloses a negative-working image recording material having excellent storability, and suitable for printing plate production. The material includes a specified diazonium salt, an infra-red absorber, and acid-triggered cross-linking agent and a binder. The binder may be selected from a wide range of polymers, including novolacs and acrylates. Imaging involves imagewise delivery of infra-red radiation followed by a post-exposure bake of short duration, prior to development.

EP-A-874282 describes negative-working image recording materials comprising a heat-triggered acid generator, an acid-triggered cross-linking agent, a binder polymer and an infra-red absorber. The materials are said to be for a lithographic printing plate, a color proof, a photoresist or a color filter, and are claimed to have a high sensitivity. In the general description a very wide range of binder polymers is described. In the examples, which are all of lithographic printing plates, the binder polymers employed are phenol resins, styrenic resins and methacrylate resins, of various structures.

WO 97/39894 describes a printing plate having a positive-working heat-imagable coating, comprising a polymeric component, an insolubilizer compound and, preferably, an IR absorber. WO 99/08879 describes the use of such a coating in the manufacture of electronic parts, for example PCBs. WO 00/20222 describes improvements to that technology. To improve mechanical properties, such as resistance to flexure, scratching and cracking, the polymeric component comprises a defined vinylphenol alkylacrylate copolymer, providing at least 20% of the weight of the composition.

While the compositions of WO 00/20222 do have better mechanical properties for PCB applications than the prior compositions of WO 99/08879 they also suffer from a poorer exposed:unexposed dissolution ratio then the prior compositions. Thus a compromise normally must be reached between good imaging properties and good mechanical properties, with neither being optimized. Also, coating them onto substrates is not always easy. In particular, coating onto certain copper substrates is far from easy. Further, they have only moderate tolerance to film weight variations.

To our surprise we have found that our negative-working compositions currently used for lithographic plates may be modified to have the robustness needed for use in the manufacture of electronic parts, with maintenance of excellent imaging properties.

Furthermore, the modified compositions offer excellent coating characteristics.

SUMMARY OF THE INVENTION

A composition for use in the present invention is heat-sensitive in that localized heating of the composition, preferably by suitable radiation, initiates a decrease in the aqueous developer solubility of the exposed areas.

Therefore according to one aspect of the present invention there is provided a method of making an electronic part, the method comprising carrying out the following steps in the order given:

a) delivering heat imagewise to a precursor of the electronic part, the precursor having a surface carrying an image-forming layer including a polymeric substance, a cross-linking agent and a thermally-activated acid generator, wherein the polymeric substance comprises a polymer containing units derived from a vinylphenol and units derived from an alkyl acrylate;

b) heating the precursor overall; and c) developing the precursor in an aqueous developer in order selectively to remove the image-forming layer in regions to which said heat was not delivered imagewise in step a).

Preferably the backbone carbon atoms of the polymer which carry respectively the phenolic and alkoxycarbonyl moieties are spaced by unsubstituted backbone carbon atoms (—CH$_2$—).

Preferably the polymer is defined by the formula (I)

wherein $R^1$ represents a hydrogen atom or alkyl group, $R^2$ represents a hydrogen atom or alkyl group, $R^3$ represents an alkyl or hydroxyalkyl group, and the ratio n/m is in the range 10/1 to 1/10.

We have found the method set out above, preferably using a polymer of formula I, to be a very effective one. The precursors we have used in such a method have excellent performance, with good imaging and development qualities and, at the same time, good mechanical properties, for example excellent flexibility, peel resistance, crack resistance and scratch resistance. Heretofore, despite considerable efforts, using other polymeric substances, we did not find it possible to optimise imaging and development qualities whilst maintaining the mechanical properties required of an electronic part precursor, in particular of an electronic part precursor of a thin flexible nature and/or which is coated on both sides. Furthermore the imaging and development qualities are maintained over an unusually wide range of coating thicknesses, typically from 2 to 10 gm$^{-2}$, and there appears to be no difficulty in achieving a good coating on copper substrates.

According to a second aspect of the invention there is provided a precursor for an electronic part, which precursor comprises a surface (not being an aluminum surface which has undergone electrograining, anodising and post-anodic treatments) and a layer carried by the surface, the layer being as defined above with reference to the first aspect.

DETAILED DESCRIPTION OF THE INVENTION

The electronic part precursor may, for example, be a precursor for any of the electronic parts set out earlier in this specification. The surface may thus be a semiconductor in which case the method may involve one or more subsequent doping steps selectively in regions in which the layer has been removed, such doping steps being for example by vapour phase, liquid immersion or by ion implantation methods. It may be an insulator which is etched to reveal a conductive or semiconductor layer below. For example it may be silica etched to reveal silicon. Alternatively it may be a conductive surface on which a wiring pattern is to be formed, for example by etching the printed circuit precursor in an etchant to remove the conductive surface selectively in the regions. Preferably, when the surface is conductive it is a copper or a copper-rich alloy. Preferably such a surface is supported by an insulating substrate. The insulating substrate is suitably a dimensionally stable plastics board, for example of epoxy resin reinforced by glass fibres. There may be a conductive surface on one or both sides of the insulating substrate.

While the surface defined herein may be an insulator requiring to be selectively subjected to etching in order to remove portions thereof to reveal an electroactive layer beneath it, preferably the surface itself is an electroactive layer. By electroactive we mean a conductor, a semiconductor or a material which when doped functions as a semiconductor. Most preferably the surface is conductive. It may suitably be a metallic sheet of thickness not exceeding 200 µm, preferably not exceeding 100 µm, most preferably not exceeding 30 µm.

When, as is preferred, an insulating substrate is provided, to support a conductive sheet on one or both sides thereof, the total thickness of the part, prior to application of a coating, including the conductive sheet or sheets, preferably does not exceed 500 µm, and more preferably does not exceed 300 µm.

A preferred part has a metal-insulator-metal sandwich structure.

In order to increase the sensitivity of an image-forming layer used in the present invention it is beneficial to include an additional component, namely a radiation absorbing compound capable of absorbing incident radiation and converting it to heat, hereinafter called a "radiation absorbing compound". A radiation absorbing compound is suitably a dye or pigment.

According to a further aspect of the present invention there is provided a precursor for an electronic part wherein the layer is adapted to preferentially absorb radiation and convert the radiation to heat.

In one embodiment of the present invention there is provided a heat-sensitive negative working precursor for an electronic part wherein the precursor includes a separate under-layer, beneath the heat-sensitive layer containing the polymer (I), wherein the under-layer comprises a radiation absorbing compound.

In the specification, when we state that the aqueous developer solubility of the layer is decreased we mean that it is substantially decreased, i.e. by an amount useful in a negative-working electronic part manufacturing process.

Preferably the aqueous developer solubility of the layer is not changed by incident UV radiation. When we state that the aqueous developer solubility of the layer is not changed by incident UV radiation we mean that it is not substantially changed (that is, by an amount which would mean that UV safelighting conditions would have to be employed) over a time span applicable to the manufacturing process involved—which in the case of electronic part manufacture means over a time span of up to 2 hours, preferably up to 6 hours, most preferably up to 24 hours. Insubstantial increases in solubility due to incident UV radiation, arising from ambient light, for example arising from daylight or ordinary white lights such as fluorescent strip lights, over such periods, may be tolerated within the scope of this invention.

Preferably a composition is applied as a liquid to the surface of the electronic part precursor and dried to form the layer. The resultant coated precursor is preferably used "fresh", that is, it is imaged, by the patternwise delivery of heat, within 14 days, preferably within 7 days, more preferably within 4 days (i.e. 96 hours), of the application of the layer, to the surface.

Alternatively, in a "dry resist" method, the layer may be laminated to the substrate. To facilitate this the layer may be carried by a peel-off plastics film.

Thus in accordance with the present invention an electronic part, whether a circuit or a circuit device, is obtained after heat-mode imaging, post-exposure and processing. The aqueous developer solubility of the layer on a precursor subjected to both heating steps and overall heating is substantially less than in the other regions. Thus, on development the unexposed areas of the layer are dissolved, preferably revealing the underlying surface. The revealed areas of the underlying surface can then be selectively subjected to a desired treatment, which in the case of electronic parts may entail etching, doping and/or deposition, and/or making electrical connections thereto. Desirably, after such treatment, the remaining areas of the layer are then removed. This may be achieved by heating the precursor to solubilize the remaining areas of the layer, then subjecting it to a developer; or, preferably, by subjecting it to a stripper liquid, for example acetone or strong alkali, for example an alkali metal hydroxide.

In accordance with a further aspect of the invention there is provided a kit for the production of electronic part precursors, the kit comprising a composition as defined herein, and surface material, the composition being in liquid form suitable for application to the surface material, to provide it on drying with the solid layer. Preferably the composition is supplied in a solvent, which is driven off during a drying step, to leave the solid layer. Suitable solvents include 1-methoxypropan-2-ol and 1-methoxy-2-propyl acetate. The amount of solvent used depends upon various parameters, for example the nature of the solvent and of the components of the composition, the coating weight and thickness required, and the coating technique employed. Generally it is desired to minimize the amount of solvent used. When a pigment is used as a radiation absorbing compound it is suitably milled, preferably with some or all of the polymer(s) of the composition. The solids content of such a composition, as applied, is preferably 10–40%, especially 15–30%, by total weight of the composition (including solvent). Such a composition suitably has a particle size of less than 10 µm, more preferably less than 5 µm, most preferably less than 1 µm, as determined by grind gauge. Preferably the surface material is a conductive material. Suitably the kit includes a developer. Suitably the kit includes a stripper liquid. Alternatively the kit may include a single liquid which can function as a developer and a stripper.

Alternatively a precursor may be supplied with a layer already provided thereon.

We will now describe further the formation of a desired pattern on a precursor, by means of a method as defined above. The layer thereon is such that it is patternwise insolubilized by heat, itself delivered patternwise. In broad terms there are three ways in which heat can be patternwise delivered to the layer, in use. These are:

the direct delivery of heat by a heated body, by conduction. For example the layer may be contacted by a heat stylus; or the reverse face of a metallic support surface onto which the layer has been coated may be contacted by a heat stylus.

the use of incident electromagnetic radiation to expose the layer, the electromagnetic radiation being converted to heat, either directly (which is preferred) or by a chemical reaction undergone by a component of the layer.

the use of charged-particle radiation, for example electron beam radiation. Clearly, at the fundamental level the charged-particle mode and the electromagnetic mode are convergent; but the distinction is clear at the practical level.

A coated precursor for an electronic part of the invention may be imagewise subjected to heat indirectly by exposure to a short duration of high intensity radiation transmitted or reflected from the background areas of a graphic original located in contact with the recording material.

In preferred methods of the invention electromagnetic radiation is used to expose the layer, the wavelength thereof entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 800 nm. Suitably it is of wavelength entirely or predominantly below 1400 nm. More preferably it is of wavelength entirely or predominantly below 1200 nm. Most preferably it is of wavelength entirely or predominantly below 1150 nm, especially below 1100 nm. Thus, suitably it is of wavelength entirely or predominantly in the range 600 to 1400 nm, more preferably 700 to 1200 nm, most preferably 800 to 1150 nm, especially 800 to 1100 nm. The electromagnetic radiation is converted to heat, either directly or by a chemical reaction undergone by a component of the layer, or a separate layer adjacent to it. The electromagnetic radiation could for example be infra-red or visible radiation. Infra-red radiation is preferred.

Preferably the radiation is delivered by a laser.

In contrast to layers used on printing plates, layers used in the present invention may suitably be non-oleophilic.

In relation to the polymer of general formula I the following definitions apply.

In general terms, any alkyl group is suitably a $C_{1-12}$ alkyl group, preferably a $C_{1-6}$ alkyl group, especially a $C_{1-4}$ alkyl group. Alkyl groups having 3 or more carbon atoms may be branched (for example t-butyl) or straight chain (for example n-butyl).

$R^1$ preferably represents a hydrogen atom or a $C_{1-4}$ alkyl group, especially a methyl group. Most preferably $R^1$ represents a hydrogen atom.

$R^2$ preferably represents a hydrogen atom or a $C_{1-4}$ alkyl group, especially a methyl group. Most preferably $R^2$ represents a hydrogen atom.

The hydroxy substituent of the phenyl group shown is preferably located para to the linkage of the phenyl group to the polymer backbone.

$R^3$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R^4$ are —$CH_3$, —$CH_2CH_2OH$, and —$CH_2CH_2CH_2CH_3$.

Preferably the ratio n/m is in the range 5/1 to 1/2. More preferably the ratio n/m is in the range 2/1 to 2/3. Most preferably the ratio n/m is in the range 3/2 to 2/3, especially 1/1.

The weight average molecular weight $M_w$ of the polymer of general formula I, as measured by gel permeation chromatography, is preferably in the range 5,000–75,000, especially 7,000–50,000.

The number average molecular weight $M_n$ of the polymer of general formula I is preferably in the range 2,000–20,000, especially 3,000–8,000.

The polymer of general formula I may be the only polymer used in the layer or it may be used in admixture with one or more other polymeric substances. In this event it preferably constitutes at least 20% of the weight of the composition, preferably at least 50%, most preferably at least 70%. There may be more than one polymer of general formula I. References herein to the proportion of such polymer or polymers are to their total content.

Other polymeric substances may be, for example, novolac resins and poly(4-hydroxystyrene).

Particularly good results have been obtained with layers comprising a polymer of general formula I, and 5 to 40%, preferably 10 to 30%, by weight of the total weight of the composition, of an additional polymer, preferably poly(4-hydroxystyrene).

Suitable cross-linking agents and thermally activated acid generators are described in U.S. Pat. Nos. 5,919,601 and 5,372,907, the contents of which are hereby incorporated in this specification by reference.

Preferably the cross-linking resin is selected from resole resins, $C_1$–$C_5$ alkoxymethyl melamine and glycoluril resins, poly($C_1$–$C_5$-alkoxy-methylstyrene), poly($C_1$–$C_5$-alkoxy-methylacrylamide) derivatives and combinations thereof.

More preferably the cross-linking resin is a resole resin prepared from a $C_1$–$C_5$ alkylphenol and formaldehyde; a tetra $C_1$–$C_5$ alkoxymethyl glycoluril; polymers of (4-methoxymethylstyrene); [(N-methoxymethyl)acrylamide]; [(N-iso-butoxymethyl)acrylamide]; and butylated phenolic resins. The cross-linking resin is incorporated in the image-forming layer in an amount of from 5 to 50, preferably 15 to 40% of the weight of the layer).

Preferably a thermally-activated acid generator used in the present invention promotes a matrix-forming reaction between the crosslinking resin and the binder resin, when the composition is exposed to a suitable radiation source. Thermally activated acid generators suitable for use in the invention include, for example, straight or branched-chain $C_1$–$C_5$ alkylsulfonates, aryl sulfonates, N—$C_1$–$C_5$ alkylsulfonyl sulfonamides, salts containing an onium cation and non-nucleophilic anion; and combinations thereof. Particularly useful aryl sulfonates include, for example, benzoin tosylate, 2-hydroxymethylbenzoin tosylate and 2,6-dinitrobenzyltosylate. Particularly useful N-alkylsulfonyl sulfonamides include N-methanesulfonyl-p-toluene sulfonamide and N-methanesulfonyl-2,4-dimethylbenzene sulfonamide. Particularly useful salts include, for example, those in which the onium cation is selected from iodonium, sulphonium, phosphonium, oxysulphoxonium, oxysulphonium, sulphoxonium, ammonium and diazonium, and the non-nucleophilic anion is selected from tetrafluoroborate, hexafluorophosphate, hexafluoroarsenate, hexafluoroantimonate, triflate, tetrakis(pentafluoro-phenyl) borate, pentafluoroethyl sulfonate, p-methyl-benzyl sulfonate, ethyl sulfonate, trifluoromethyl acetate and pentafluoroethyl acetate. The thermally-activated acid generator is preferably incorporated in the image-forming layer in an amount of from about 1 to 25, preferably 5 to 20% of the weight of the layer.

The aqueous developer is dependent on the nature of the polymeric substance. Common components of aqueous lithographic developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates or being an alkali metal hydroxide. We have found an alkali metal hydroxide, for example sodium hydroxide or potassium hydroxide, to be suitable both as a developer and as a stripper.

A large number of compounds, or combinations thereof, can be utilized as radiation absorbing compounds in preferred embodiments of the present invention.

In preferred embodiments the radiation absorbing compound absorbs infra-red radiation, for example 1064 nm or 830 nm radiation from a Nd-YAG laser or Creo Trendsetter (trade mark) imagesetter.

The radiation absorbing compound may usefully be a pigment, which is a black body or broad band absorber. It may be carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

The radiation absorbing compound may usefully be an infra-red absorbing dye able to absorb the radiation selected for imaging and convert it to heat.

Preferably the infra-red absorbing compound is one whose absorption spectrum is significant at the wavelength output of the laser which is (in preferred embodiments) to be used in the method of the present invention. Usefully it may be an organic pigment or dye such as phthalocyanine pigment. Or it may be a dye or pigment of the squarylium, merocyanine, cyanine, indolizine, pyrylium or metal dithioline classes.

Examples of such compounds are:

and SDB7047, believed to have the structure:

and KF 654B PINA, believed to have the structure:

KF 654B PINA is an especially preferred component of compositions used in the present invention, and functions as a reversible insolubilizer compound as well as an absorber.

Pigments are generally insoluble in the compositions (and in the dried layers) and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they do not have any marked effect on the solubility of the unheated layer, in the developer. In contrast dyes are generally soluble in the layers. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Frequently they have a marked effect on the solubility of the unheated layer in the developer, typically making it much less soluble.

Suitably the radiation absorbing compound, when present, constitutes at least 0.25%, preferably at least 0.5%, more preferably at least 1%, most preferably at least 2%, of the total weight of the layer. Suitably the radiation absorbing compound, when present, constitutes up to 25%, preferably up to 20%, and most preferably up to 15%, of the total weight of the layer. More specifically, in the case of dyes the range may preferably be 0.25–15% of the total weight of the layer, preferably 0.5–8%, whilst in the case of pigments the range may preferably be 1–25%, preferably 2–15%. For pigments, 5–15% may be especially suitable. In each case the figures given are as a percentage of the total weight of the dried layer. There may be more than one radiation absorbing compound. References herein to the proportion of such compound or compounds are to their total content.

In one preferred embodiment of the invention an additional layer comprising a radiation absorbing compound can be used. This multiple layer construction can provide routes to high sensitivity as larger quantities of absorber can be used without affecting the function of the image-forming layer. In principle any radiation absorbing material which absorbs sufficiently strongly in the desired wavelength can be incorporated or fabricated in a uniform coating. Dyes, metals and pigments (including metal oxides) may be used in the form of vapour deposited layers, techniques for forming and use of such films are well known in the art, for example EP 652,483.

The image-forming layer may contain other ingredients such as stabilising additives, surfactants, plasticisers, inert colourants, additional inert polymeric binders as are present in many radiation sensitive compositions.

It is important that an entire surface of the precursor before development is covered by the image-forming layer, and that the heated areas of the surface after development remain covered. If wished the layer can be comparatively thick. A suitable range for the (dried) coating is $0.5-12$ g/m$^2$, preferably $2-10$ g/m$^2$, and most preferably $3-8$ g/m$^2$.

Preferably the mean peak to valley height Rz (as measured by test DIN 4777) of the surface of the precursor to which the composition is applied is less than 5 μm, preferably less than 2 μm (when measured in any direction).

Prior to the application of the composition to the precursor the precursor is preferably treated with a cleaning or anti-tarnishing agent, suitably an acid, for example aqueous citric acid, then rinsed thoroughly and dried.

Preferably the sensitivity of the preferred image-forming layer should be at a practicable level but suitably no more than 600 mJcm$^{-2}$, more preferably no more than 400 mJcm$^{-2}$, more preferably no more than 300 mJcm$^{-2}$.

Any feature of any aspect of the present invention or embodiment described herein may be combined with any feature of any other aspect of any invention or embodiment described herein.

Figure 1:
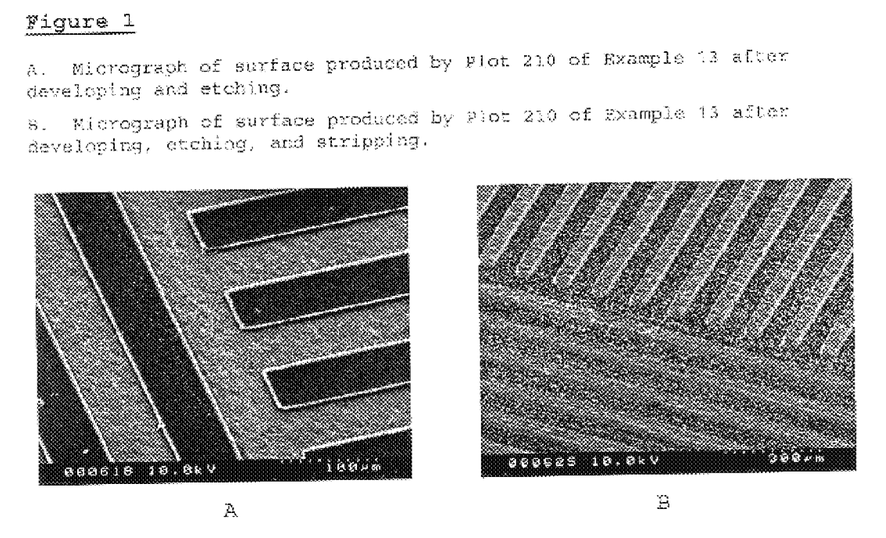
FIG. 1 depicts micrographs relating to Example 13.
Figure 2:
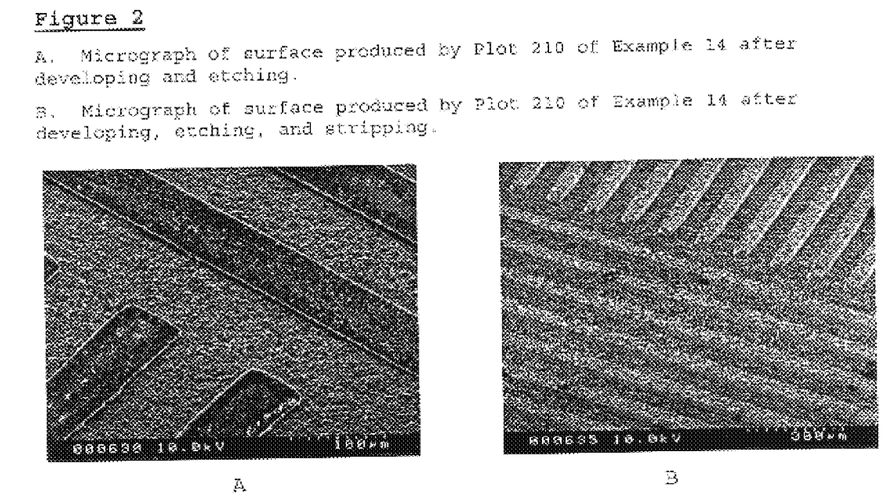
FIG. 2 depicts micrographs relating to Example 14.

The following examples more particularly serve to illustrate the various aspects of the present invention described hereinabove. With reference to the Examples, FIGS. 1 and 2 are photomicrographs following imaging tests carried out on copper substrates coated with the compositions set out in Examples 13 and 14. The prefix "c" denotes the relevant Example was a comparative Example (for example c1).

EXAMPLES

The following products are referred to hereafter:

Cross Linking Agent A—GP649D99 modified phenol-formaldehyde resin as supplied by Georgia Pacific Resins Inc. of Decatur, Ga.

Cross Linking Agent B—LA9435 modified phenol-formaldehyde resin as supplied by Bakelite, Iserlohn-Letmathe, Germany.

Cross Linking Agent C—Cymel 303 methylated melamine formaldehyde cross-linker as supplied by Charles Tennant and Co LTD, Waltham Abbey, UK.

Cross Linking Agent D—Beetle 3747 hexamethoxymethyl melamine cross-linker as supplied by B.I.P. LTD, Warley, UK.

Binder A—N13 novolak resin as supplied by the Eastman Kodak Company, Rochester, N.Y.

Binder B—FK060 vinylphenol/butyl acrylate copolymer, 50/50 (mol/mol), Mw 42,000, Mn 10,000, of structure:

as supplied by Siber Hegner Ltd, Beckenham, UK.

Binder C—Lyncur CBA, vinylphenol/butyl acrylate copolymer, 50/50 (mol/mol), Mw 10,000–30,000, Mn 12,000 as supplied by Siber Hegner.

Binder D—Lyncur MS-4, poly(vinylphenol) polymer, Mw 11,000, Mn 5,000 as supplied by Siber Hegner.

Binder E—FK052, vinylphenol/ethylhexyl acrylate copolymer, 60/40 (mol/mol), Mw 33,000, Mn 9,000, of structure:

as supplied by Siber Hegner.

Binder F—Lyncur CST50, vinylphenol/styrene copolymer, 50/50 (mol/mol), Mw 5,000, Mn 2,000–3,000, as supplied by Siber Hegner.

Binder G—Lyncur CHM, vinylphenol/hydroxyethylmethacrylate copolymer, 50/50 (mol/mol), Mw 7,000–14,000, Mn 3,000–5,000, as supplied by Siber Hegner.

Binder H—Lyncur CMM, vinylphenol/methyhnethacrylate copolymer, 50/50 (mol/mol), Mw 8,000–12,000, Mn 3,000–5,000, as supplied by Siber Hegner.

Binder I—T95 resin, a terpolymer of n-(methoxymethyl)methacrylamide/methacrylic acid/benzylmethacrylate, with monomer ratios of approximately 60/15/25 (mol/mol/mol) and the following structure:

as supplied by PCAS, Longjumeau Cedex, France.

Acid Generator A—Diazo MSPF6 as supplied by Diversitec Corporation, Fort Collins, Colo.

Infrared Dye A—having the following structure:

Dye A—Simbase Victoria Blue FBO 23363, as supplied by Charkit Chemical Corporation, Darien, Conn., USA.

Developer A—GOLDSTAR (trade mark), a sodium metasilicate-based developer, as supplied by Kodak Polychrome Graphics, Watford, UK.

Developer B—Kodak Professional Aqua Image Negative Developer, a solvent-based developer, as supplied by Eastman Kodak Company, Rochester, N.Y., USA.

Etching Solution A—20% anhydrous cupric chloride and 9% hydrochloric acid in water. Cupric chloride and hydrochloric acid are supplied by William Blythe, Oswaldtwistle, UK and Ellis and Everard, Bradford, UK, respectively.

Substrate A—double sided copper laminate of overall thickness 254 μm, having copper cladding 18 μm thick on each side of an insulating substrate, catalogue number N4105-2, 0.008, Cu H/H HTE, as supplied by New England Laminates (UK) Ltd., of Skelmersdale, UK.

Substrate B—Reverse treated copper laminate of overall thickness 254 μm, having copper cladding 18 μm thick on each side of an insulating substrate, catalogue number N4105-2, 0.008, Cu H/H MLS, as supplied by New England Laminates.

In all cases Substrates A and B were treated to remove tarnish by washing with water, rinsing with a 2% solution of citric acid for 30 seconds, washing again with distilled water, and drying for 60 seconds at 90° C.

Prior to the anti-tarnish treatment, Substrate A was subject a microetch treatment. Laminates were passed through a spray processor, supplied by PCB Machinery Ltd of Haslingden, UK. The processor was charged with MecBrite CA 92R microetch solution as supplied by MEC Europe, of Gent, Belgium. Laminate was subject to a 20 second spray treatment at 23° C. followed by a water rinse.

Creo Trendsetter (trade mark) 3244—a commercially available platesetter, using Procom Plus software, operating at a wavelength of 830 nm at a power of 6.5 W and supplied by Creo Products Inc. of Burnaby, Canada.

Coatings were dried using a Mathis Labdrier as supplied by Werner Mathis AG, Zurich, Switzerland. After exposure on a Creo Trendsetter, the coatings were subject to a baking step using the Mathis Labdryer.

The micrographs (FIGS. 1 and 2) were obtained with a Hitachi S-4100 field emission scanning electron microscope as supplied by Nissei Sangyo Co Ltd, Berkshire, UK. Samples were examined at a tilt of 45° using the secondary electron detector.

Formulation Examples

The tables below identify the formulations which were prepared. Coating Components:

Example 1

The components were prepared as a 14% w/w solution in 1-methoxypropan-2-ol, acetone and dimethylformamide, 40 parts, 40 parts and 20 parts by weight, respectively.

The composition was applied to one side of Substrate A by means of a wire wound bar to achieve a dry film weight of 3.5 $gm^{-2}$ after thorough drying at 110° C. for 120 seconds.

A sample of the printed circuit board precursor was imaged on the Trendsetter 3244, using the internal test pattern, plot 0 at 6.5 W, 156 rpm, 300 $mJcm^{-2}$.

The exposed precursor was then subject to a bake at 130° C. for 80 seconds before development by immersion in Developer A for 60 seconds at 20° C. Under these imaging, baking and developing conditions, the 50% dots laid down by the Trendsetter were accurately reproduced as a 50% dot relief image on the substrate.

Example c2

The components were prepared as a 14% w/w solution in 1-methoxypropan-2-ol, acetone and dimethylformamide, 27 parts, 53 parts and 20 parts by weight, respectively.

| Example | Cross-Linking Agent 1 | Cross-Linking Agent 2 | Binder 1 | Binder 2 | Acid Generator | IR dye | Dye |
|---|---|---|---|---|---|---|---|
| c1 | Crosslinker A | | Binder A | | Acid Generator A | IR dye A | Dye A |
| c2 | Crosslinker D | | Binder A | | Acid Generator A | IR Dye A | Dye A |
| c3 | Crosslinker A | | Binder A | | Acid Generator A | IR Dye A | Dye A |
| 4 | Crosslinker A | | Binder C | | Acid Generator A | IR Dye A | Dye A |
| 5 | Crosslinker A | Crosslinker D | Binder C | | Acid Generator A | IR Dye A | Dye A |
| 6 | Crosslinker A | Crosslinker E | Binder C | | Acid Generator A | IR Dye A | Dye A |
| c7 | Crosslinker A | | Binder D | | Acid Generator A | IR Dye A | Dye A |
| 8 | Crosslinker A | | Binder B | | Acid Generator A | IR Dye A | Dye A |
| 9 | Crosslinker A | | Binder E | | Acid Generator A | IR Dye A | Dye A |
| c10 | Crosslinker A | | Binder F | | Acid Generator A | IR Dye A | Dye A |
| c11 | Crosslinker A | | Binder G | | Acid Generator A | IR Dye A | Dye A |
| c12 | Crosslinker A | | Binder H | | Acid Generator A | IR Dye A | Dye A |
| 13 | Crosslinker A | | Binder A | Binder B | Acid Generator A | IR Dye A | Dye A |
| 14 | Crosslinker A | | Binder A | Binder B | Acid Generator A | IR Dye A | Dye A |
| c15 | Crosslinker B | | Binder I | | Acid Generator A | IR Dye A | Dye A |

Coating Components (expressed at wt % of the dried coating):

| Example | Cross-Linking Agent 1 | Cross-Linking Agent 2 | Binder 1 | Binder 2 | Acid Generator | IR dye | Dye |
|---|---|---|---|---|---|---|---|
| c1 | 28.3 | | 56.1 | | 7 | 7.6 | 1 |
| c2 | 28.3 | | 56.1 | | 7 | 7.6 | 1 |
| c3 | 32.6 | | 52.3 | | 7 | 7.6 | 0.5 |
| 4 | 32.6 | | 52.3 | | 7 | 7.6 | 0.5 |
| 5 | 37.6 | 5 | 42.3 | | 7 | 7.6 | 0.5 |
| 6 | 37.6 | 5 | 42.3 | | 7 | 7.6 | 0.5 |
| c7 | 30 | | 55.3 | | 7 | 7.2 | 0.5 |
| 8 | 30 | | 55.3 | | 7 | 7.2 | 0.5 |
| 9 | 30 | | 55.3 | | 7 | 7.2 | 0.5 |
| c10 | 30 | | 55.3 | | 7 | 7.2 | 0.5 |
| c11 | 30 | | 55.3 | | 7 | 7.2 | 0.5 |
| c12 | 30 | | 55.3 | | 7 | 7.2 | 0.5 |
| 13 | 26.25 | | 8.75 | 50.7 | 7 | 7 | 0.3 |
| 14 | 26.25 | | 8.75 | 50.7 | 7 | 7 | 0.3 |
| c15 | 17 | | 68.5 | | 7 | 7 | 0.5 |

Using these formulations precursors were made, as described below.

In each example, imaging was carried out within 48 hours of coating.

The composition was applied to one side of Substrate A by means of a wire wound bar to achieve a dry film weight of 3.5 $gm^{-2}$ after thorough drying at 110° C. for 120 seconds.

A sample of the printed circuit board precursor was imaged on the Trendsetter 3244, using the internal test pattern, plot 0 at 6.5 W, 188 rpm, 250 $mJcm^{-2}$.

The exposed precursor was then subject to a bake at 130° C. for 100 seconds before development by immersion in Developer B for 60 seconds at 20° C. Under these imaging, baking and developing conditions, the 50% dots laid down by the Trendsetter were accurately reproduced as a 50% dot relief image on the substrate.

Example c3

The components were prepared as a 18% w/w solution in 1-methoxypropan-2-ol, acetone and dimethylformamide, 57 parts, 17 parts and 26 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 156 rpm, 300 mJcm$^{-2}$.

The exposed precursor was then subject to a bake at 130° C. for 100 seconds before development by immersion in Developer A for 40 seconds at 20° C. Under these imaging, baking and developing conditions, the 50% dots laid down by the Trendsetter were accurately reproduced as a 50% dot relief image on the substrate.

Example 4

The components were prepared as a 18% w/w solution in 1-methoxypropan-2-ol, acetone and dimethylformamide, 70 parts, 4 parts and 26 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 117 rpm, 400 mJcm$^{-2}$.

The exposed precursor was then subject to a bake at 140° C. for 100 seconds before development by immersion in Developer A for 30 seconds at 20° C. Under these imaging, baking and developing conditions, the 50% dots laid down by the Trendsetter were accurately reproduced as a 50% dot relief image on the substrate.

Example 5

The components were prepared as a 18% w/w solution in 1-methoxypropan-2-ol, acetone and dimethylformamide, 64 parts, 7 parts and 29 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 134 rpm, 350 mJcm$^{-2}$.

The exposed precursor was then subject to a bake at 130° C. for 60 seconds before development by immersion in Developer A for 15 seconds at 20° C. Under these imaging, baking and developing conditions, the 50% dots laid down by the Trendsetter were accurately reproduced as a 50% dot relief image on the substrate.

Example 6

The components were prepared as a 18% w/w solution in 1-methoxypropan-2-ol, acetone, dimethylformamide and isobutanol, 64 parts, 6 parts, 29 parts and 1 part by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 156 rpm, 300 mJcm$^{-2}$.

The exposed precursor was then subject to a bake at 130° C. for 40 seconds before development by immersion in Developer A for 60 seconds at 20° C. Under these imaging, baking and developing conditions, the 50% dots laid down by the Trendsetter were accurately reproduced as a 50% dot relief image on the substrate.

Example c7

The components were prepared as a 18% w/w solution in 1-methoxypropan-2-ol, acetone and dimethylformamide, 52 parts, 19 parts and 29 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 94 rpm, 500 mJcm$^{-2}$.

The exposed precursor was then subject to a bake at 140° C. for 100 seconds before development by immersion in Developer A for 10 seconds at 20° C. Under these imaging, baking and developing conditions, the 50% dots laid down by the Trendsetter were accurately reproduced as a 50% dot relief image on the substrate.

Example 8

The components were prepared as a 18% w/w solution in 1-methoxypropan-2-ol, acetone and dimethylformamide, 52 parts, 19 parts and 29 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 156 rpm, 350 mJcm$^{-2}$.

The exposed precursor was then subject to a bake at 140° C. for 90 seconds before development by immersion in Developer A for 50 seconds at 20° C. Under these imaging, baking and developing conditions, the 50% dots laid down by the Trendsetter were accurately reproduced as a 50% dot relief image on the substrate.

Example 9

The components were prepared as a 18% w/w solution in 1-methoxypropan-2-ol, acetone and dimethylformamide, 52 parts, 19 parts and 29 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 117 rpm, 400 mJcm$^{-2}$.

The exposed precursor was then subject to a bake at 140° C. for 60 seconds before development by immersion in Developer A for 60 seconds at 20° C. Under these imaging, baking and developing conditions, the 50% dots laid down by the Trendsetter were accurately reproduced as a 50% dot relief image on the substrate.

Example c10

The components were prepared as a 18% w/w solution in 1-methoxypropan-2-ol, acetone and dimethylformamide, 52 parts, 19 parts and 29 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 156 rpm, 300 mJcm$^{-2}$.

The exposed precursor was then subject to a bake at 140° C. for 40 seconds before development by immersion in Developer A for 60 seconds at 20° C. Under these imaging, baking and developing conditions, the 50% dots laid down by the Trendsetter were accurately reproduced as a 50% dot relief image on the substrate.

Example c11

The components were prepared as a 18% w/w solution in 1-methoxypropan-2-ol, acetone and dimethylformamide, 52 parts, 19 parts and 29 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 94 rpm, 500 mJcm$^{-2}$.

The exposed precursor was then subject to a bake at 140° C. for 120 seconds before development by immersion in Developer A for 40 seconds at 20° C. Under these imaging, baking and developing conditions, the 50% dots laid down by the Trendsetter were accurately reproduced as a 50% dot relief image on the substrate.

Example c12

The components were prepared as a 18% w/w solution in 1-methoxypropan-2-ol, acetone and dimethylformamide, 52 parts, 19 parts and 29 parts by weight, respectively.

The composition was applied to one side of Substrate A by means of a wire wound bar to achieve a dry film weight of 4.7 gm$^{-2}$ after thorough drying at 110° C. for 120 seconds.

A sample of the printed circuit board precursor was imaged on the Trendsetter 3244, using the internal test pattern, plot 0 at 6.5 W, 117 rpm, 400 mJcm$^{-2}$.

The exposed precursor was then subject to a bake at 140° C. for 100 seconds before development by immersion in Developer A for 60 seconds at 20° C. Under these imaging, baking and developing conditions, the 50% dots laid down by the Trendsetter were accurately reproduced as a 50% dot relief image on the substrate.

Example 13

The components were prepared as a 19% w/w solution in 1-methoxypropan-2-ol, acetone and dimethylformamide, 65 parts, 4 parts and 31 parts by weight, respectively.

The composition was applied to one side of Substrate A by means of a wire wound bar to achieve a dry film weight of 5.0 gm$^{-2}$ after thorough drying at 110° C. for 120 seconds.

A sample of the printed circuit board precursor was imaged on the Trendsetter 3244, using the internal test patterns Plot 205 and Plot 210 at 6.5 W, 157 rpm, 300 mJcm$^{-2}$.

The exposed precursor was then subject to a bake at 140° C. for 80 seconds before development by immersion in Developer A for 60 seconds at 20° C. Under these imaging, baking and developing conditions, the 50% dots laid down by the Trendsetter were accurately reproduced as a 50% dot relief image on the substrate.

The imaged PCB precursor was passed through a spray processor supplied by PCB Machinery Ltd, charged with Etching Solution A at 45° C.

The remaining coating was stripped with acetone to yield the image in copper. Plot 205 produced defect-free 30 micron tracks with 50 micron gaps. Plot 210 produced defect-free 70 micron tracks and 90 micron gaps. FIG. 1 shows micrographs of the surface produced by Plot 210, with and without stripping of the remaining coating.

Example 14

The components were prepared as a 19% w/w solution in 1-methoxypropan-2-ol, acetone and dimethylformamide, 65 parts, 4 parts and 31 parts by weight, respectively.

The composition was applied to one side of Substrate B by means of a wire wound bar to achieve a dry film weight of 7.0 gm$^{-2}$ after thorough drying at 110° C. for 120 seconds.

A sample of the printed circuit board precursor was imaged on the Trendsetter 3244, using the internal test patterns Plot 205 and Plot 210 at 6.5 W, 117 rpm, 400 mJcm$^{-2}$.

The exposed precursor was then subject to a bake at 140° C. for 80 seconds before development by immersion in Developer A for 50 seconds at 20° C. Under these imaging, baking and developing conditions, the 50% dots laid down by the trendsetter were accurately reproduced as a 50% dot relief image on the substrate.

The imaged PCB precursor was passed through a spray processor supplied by PCB Machinery Ltd, charged with Etching Solution A at 45° C.

The remaining resist was removed with acetone to yield the image in copper. Plot 205 produced defect-free 30 micron tracks with 50 micron gaps. Plot 210 produced defect-free 70 micron tracks and 90 micron gaps. FIG. 2 shows micrographs of the surface produced by Plot 210, with and without stripping of the remaining coating.

Example c15

The components were prepared as a 18% w/w solution in 1-methoxypropan-2-ol and dimethylformamide, 67 parts, and 23 parts by weight, respectively.

The composition was applied to one side of Substrate A by means of a wire wound bar to achieve a dry film weight of 4.7 gm$^{-2}$ after thorough drying at 110° C. for 120 seconds.

A sample of the print ed circuit board precursor was imaged on the Trendsetter 3244, using the internal test patterns Plot 205 and Plot 210 at 6.5 W, 94 rpm, 500 mJcm$^{-2}$.

The exposed precursor was then subject to a bake at 130° C. for 60 seconds before is development by immersion in Developer B for 60 seconds at 20° C. Under these imaging, baking and developing conditions, the 50% dots laid down by the Trendsetter were accurately reproduced as a 50% dot relief image on the substrate.

The imaged PCB precursor was passed through a spray processor supplied by PCB Machinery Ltd, charged with etching solution A at 45° C.

The remaining resist was removed with acetone to yield the image in copper. Plot 205 produced defect-free 30 micron tracks with 50 micron gaps. Plot 210 produced defect-free 70 micron tracks and 90 micron gaps.

Hardness Testing

The non-imaged precursors were subjected to a scratch test using a Dur-O-Test instrument manufactured by BYK-Gardner GmbH, of Geretsried, Germany.

The instrument consists of a sleeve containing a pressure spring that can be compressed to various tensions by means of a slide. The spring acts upon a protruding tungsten carbide needle. The spring can be replaced in order to change the force available to the user. For these tests the red spring was used giving a force of 0 to 1000 grams. The needle of the instrument was placed perpendicularly onto the layer. A line was drawn approximately 5 cm long within 1 second, whilst pressing the Dur-O-Tester against the specimen until the plane jacket end contacted the test surface. If the copper substrate was seen through the layer, the specimen failed the test. If a mark was made on the layer without breaking through to the copper, a pass was declared.

To prevent losses due to handling damage the precursors should be able to withstand a force of 400 g, preferably 600 g, and more preferably 800 g.

Hardness Testing, Examples c1–c15

| Example | Spring force (grams) |
| --- | --- |
| c1 | <50 |
| c2 | <50 |
| c3 | <50 |
| 4 | 700 |
| 5 | 500 |
| 6 | 500 |
| c7 | <50 |
| 8 | 900 |
| 9 | 600 |
| c10 | <50 |
| c11 | <50 |
| c12 | <50 |
| c13 | 800 |
| 14 | 800 |
| c15 | 100 |

It is noteworthy that good mechanical properties were shown only by Examples 4, 5, 6, 8, 9, 13 and 14. These all employed as the binder a copolymer of a vinylphenol and an alkyl acrylate. The comparative examples employed binders of polyvinylphenol, vinylphenol/styrene copolymer, vinylphenol/alkyl methacrylate copolymer and a mixed acrylate terpolymer, but all gave poor mechanical properties.

What is claimed is:

1. A negative-working method of making an electronic part, the method comprising carrying out the following steps in the order given:
    a) delivering heat imagewise to a precursor of the electronic part, the precursor having a surface carrying an image-forming layer which comprises: (i) a polymeric composition, (ii) a cross-linking agent, and (iii) a thermally-activated acid generator, wherein the polymeric composition comprises a polymer containing units derived from a vinylphenol and units derived from an and alkyl acrylate;
    b) heating the precursor overall; and
    c) developing the precursor in an aqueous developer to selectively remove the image-forming layer in regions in which heat was not imagewise delivered in step a).
2. The method as claimed in claim 1, wherein the polymeric composition is of the formula wherein $R^1$ represents a hydrogen atom or alkyl group, $R^2$ represents a hydrogen atom or alkyl group, $R^3$ represents an alkyl or hydroxyalkyl group, and the ratio n/m is in the range 10/1 to 1/10.

3. The method as claimed in claim 2, wherein $R^1$ represents a hydrogen atom, $R^2$ represents a hydrogen atom and $R^3$ represents a $C_{1-12}$ alkyl group.

4. The method as claimed in claim 1, wherein said polymeric composition comprises at least 20% of the weight of the image-forming layer.

5. The method as claimed in claim 4, wherein the polymeric composition comprises at least 40% of the weight of the image-forming layer.

6. The method as claimed in claim 1, wherein radiation is delivered to the precursor and wherein said image-forming layer comprises a radiation absorbing compound which absorbs the radiation and converts the radiation to heat.

7. The method as claimed in claim 6, wherein the radiation is delivered from a laser which emits radiation at above 600 nm.

8. The method as claimed in claim 1, wherein the heat is delivered from a heated body.

9. A negative-working precursor for an electronic part, which comprises a surface which is not an aluminum surface which has undergone electrograining, anodising and post-anodic treatments and an image-forming layer on the surface, wherein the image-forming layer comprises: (i) a polymeric composition, (ii) a cross-linking agent, and (iii) a thermally-activated acid generator, wherein the polymeric composition comprises a polymer containing units derived from a vinylphenol and units derived from an alkyl acrylate.

10. The precursor as claimed in claim 9, comprising a body of metal-insulator-metal sandwich structure coated on both sides with the image-forming layer.

11. The precursor as claimed in claim 9, wherein the surface comprises copper or a copper-rich alloy.

12. A kit for the manufacture of electronic parts, the kit comprising a heat-sensitive composition and a material comprising a surface, wherein the composition is in liquid form suitable for application to the the material, such that upon drying the composition provides an image-forming layer which comprises: (i) a polymeric composition, (ii) a cross-linking agent, and (iii) a thermally-activated acid generator, wherein the polymeric composition comprises a polymer containing units derived from a vinylphenol and units derived from an alkyl acrylate.

* * * * *

UNITED STATES PATENT AND TRADEMARK OFFICE
CERTIFICATE OF CORRECTION

PATENT NO. : 6,451,502 B1
DATED : September 17, 2002
INVENTOR(S) : Kevin Barry Ray et al.

It is certified that error appears in the above-identified patent and that said Letters Patent is hereby corrected as shown below:

Column 19,
Line 55, replace "an and" with -- an --

Column 20,
Line 53, replace "the the material," with -- the material --

Signed and Sealed this

First Day of April, 2003

JAMES E. ROGAN
*Director of the United States Patent and Trademark Office*